United States Patent
Rice et al.

(10) Patent No.: US 11,397,198 B2
(45) Date of Patent: Jul. 26, 2022

(54) WIRELESS CURRENT SENSOR

(71) Applicant: Schweitzer Engineering Laboratories, Inc., Pullman, WA (US)

(72) Inventors: Raymond W. Rice, Pullman, WA (US); Benjamin T. Rowland, Pullman, WA (US); James Mobley, Moscow, ID (US); Shankar V. Achanta, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 284 days.

(21) Appl. No.: 16/549,774

(22) Filed: Aug. 23, 2019

(65) Prior Publication Data

US 2021/0055332 A1 Feb. 25, 2021

(51) Int. Cl.
*G01R 19/15* (2006.01)
*G01R 19/155* (2006.01)
*G01R 19/257* (2006.01)

(52) U.S. Cl.
CPC .......... *G01R 19/15* (2013.01); *G01R 19/155* (2013.01); *G01R 19/257* (2013.01)

(58) Field of Classification Search
None
See application file for complete search history.

(56) References Cited

U.S. PATENT DOCUMENTS

| | | | |
|---|---|---|---|
| 2,379,664 A | 7/1945 | Stanko |
| 2,928,048 A | 3/1960 | Postal |
| 2,967,267 A | 1/1961 | Steinman |
| 3,239,678 A | 3/1966 | Kolm |
| 3,292,579 A | 12/1966 | Buchanan |
| 3,296,493 A | 1/1967 | Whittaker |
| 3,476,997 A | 11/1969 | Otzipka |
| 3,525,903 A | 8/1970 | Morris |
| 3,621,334 A | 11/1971 | Burns |
| 3,676,740 A | 7/1972 | Schweitzer |

(Continued)

OTHER PUBLICATIONS

Cooper Power Systems, GridAdvisor; OutageAdvisor Fault Detection and Location Solution, B320-08001, 2008, www.cooperpower.com, pp. 1-8.

(Continued)

*Primary Examiner* — Daniel C Puentes
(74) *Attorney, Agent, or Firm* — Jared L. Cherry

(57) ABSTRACT

The present disclosure pertains to systems and methods for measuring electrical parameters in an electric power system. In one embodiment, a system may include a line-mounted wireless current sensor comprising a current monitoring subsystem to generate a current measurement of an alternating current flow through an electrical conductor. The line-mounted wireless current sensor may harvest power from the electrical conductor. A processing subsystem may generate a message comprising the current measurement, and the message may be transmitted at a synchronization point using a wireless communication subsystem. An intelligent electronic device (IED) may receive the message. The IED may further generate a voltage and generate a phasor based on the current measurement and the voltage measurement. A control action subsystem may implement a control action (e.g., selectively connecting or disconnecting a capacitor bank) based on the phasor.

19 Claims, 4 Drawing Sheets

(56) References Cited

U.S. PATENT DOCUMENTS

| | | |
|---|---|---|
| 3,702,966 A | 11/1972 | Schweitzer |
| 3,706,930 A | 12/1972 | Harner |
| 3,708,724 A | 1/1973 | Schweitzer |
| 3,715,742 A | 2/1973 | Schweitzer |
| 3,781,682 A | 12/1973 | Schweitzer |
| 3,816,816 A | 6/1974 | Schweitzer |
| 3,866,197 A | 2/1975 | Schweitzer |
| 3,876,911 A | 4/1975 | Schweitzer |
| 3,906,477 A | 9/1975 | Schweitzer |
| 3,972,581 A | 8/1976 | Oldham |
| 3,974,446 A | 8/1976 | Schweitzer |
| 4,029,951 A | 6/1977 | Berry |
| 4,034,360 A | 7/1977 | Schweitzer |
| 4,038,625 A | 7/1977 | Tompkins |
| 4,045,726 A | 8/1977 | Schweitzer |
| 4,063,171 A | 12/1977 | Schweitzer |
| 4,086,529 A | 4/1978 | Schweitzer |
| 4,112,292 A | 9/1978 | Varvel |
| 4,144,485 A | 3/1979 | Akita |
| 4,165,528 A | 8/1979 | Schweitzer |
| 4,186,986 A | 2/1980 | Shoemaker |
| 4,199,741 A | 4/1980 | Paulet |
| 4,234,847 A | 11/1980 | Schweitzer |
| 4,251,770 A | 2/1981 | Schweitzer |
| 4,288,743 A | 9/1981 | Schweitzer |
| 4,375,617 A | 3/1983 | Schweitzer |
| 4,414,543 A | 11/1983 | Schweitzer |
| 4,424,512 A | 1/1984 | Schweitzer |
| 4,438,403 A | 3/1984 | Schweitzer |
| 4,456,873 A | 6/1984 | Schweitzer |
| 4,458,198 A | 7/1984 | Schweitzer |
| 4,495,489 A | 1/1985 | Schweitzer |
| 4,536,758 A | 8/1985 | Schweitzer |
| 4,599,487 A | 7/1986 | Blank |
| 4,686,518 A | 8/1987 | Schweitzer |
| 4,689,752 A | 8/1987 | Fernandes et al. |
| 4,709,339 A | 11/1987 | Fernandes |
| 4,794,328 A | 12/1988 | Fernandes et al. |
| 4,794,329 A | 12/1988 | Schweitzer |
| 4,794,332 A | 12/1988 | Schweitzer |
| 4,795,982 A | 1/1989 | Schweitzer |
| 4,829,298 A | 5/1989 | Fernandes |
| 4,940,976 A | 7/1990 | Gastouniotis |
| 4,996,624 A | 2/1991 | Schweitzer |
| 5,008,651 A | 4/1991 | Schweitzer |
| 5,038,246 A | 8/1991 | Durivage |
| 5,070,301 A | 12/1991 | Schweitzer |
| 5,089,928 A | 2/1992 | Durivage |
| 5,136,457 A | 8/1992 | Durivage |
| 5,136,458 A | 8/1992 | Durivage |
| 5,140,257 A | 8/1992 | Davis |
| 5,150,361 A | 9/1992 | Wieczorek |
| 5,153,565 A | 10/1992 | Schweitzer |
| 5,168,414 A | 12/1992 | Horstmann |
| 5,196,682 A | 3/1993 | Englehardt |
| 5,220,311 A | 6/1993 | Schweitzer |
| 5,293,323 A | 3/1994 | Doskocil |
| 5,298,894 A | 3/1994 | Cerney |
| 5,343,155 A | 8/1994 | Kejariwal et al. |
| 5,420,502 A | 5/1995 | Schweitzer |
| 5,438,329 A | 8/1995 | Gastouniotis |
| 5,495,239 A | 2/1996 | Ouellete |
| 5,519,527 A | 5/1996 | Panton |
| 5,542,856 A | 8/1996 | Wood |
| 5,550,476 A | 8/1996 | Lau |
| 5,565,783 A | 10/1996 | Lau |
| 5,608,306 A | 3/1997 | Rybeck |
| 5,648,726 A | 7/1997 | Le |
| 5,656,931 A | 8/1997 | Lau |
| 5,659,300 A | 8/1997 | Dresselhuys |
| 5,677,623 A | 10/1997 | Schweitzer |
| 5,677,678 A | 10/1997 | Schweitzer |
| 5,701,121 A | 12/1997 | Murdoch |
| 5,793,214 A | 8/1998 | Wakamatsu |
| 5,808,902 A | 9/1998 | Levert et al. |
| 5,821,869 A | 10/1998 | Schweitzer |
| 5,825,303 A | 10/1998 | Bloss |
| 5,861,684 A | 1/1999 | Slade |
| 5,862,186 A | 1/1999 | Kumar |
| 5,862,391 A | 1/1999 | Salas |
| 5,877,703 A | 3/1999 | Bloss |
| 5,889,399 A | 3/1999 | Schweitzer |
| 5,892,430 A | 4/1999 | Wiesman et al. |
| 5,990,674 A | 11/1999 | Schweitzer |
| 6,002,260 A | 12/1999 | Lau |
| 6,014,301 A | 1/2000 | Schweitzer |
| 6,016,105 A | 1/2000 | Schweitzer |
| 6,029,061 A | 2/2000 | Kohlschmidt |
| 6,072,405 A | 6/2000 | Sears |
| 6,078,785 A | 6/2000 | Bush |
| 6,133,723 A | 10/2000 | Feight |
| 6,133,724 A | 10/2000 | Schweitzer |
| 6,177,883 B1 | 1/2001 | Jannetti |
| 6,188,216 B1 | 2/2001 | Fromer |
| 6,236,722 B1 | 5/2001 | Colton |
| 6,304,176 B1 | 10/2001 | Discenzo |
| 6,326,905 B1 | 12/2001 | Walters |
| 6,349,248 B1 | 2/2002 | Dean |
| 6,366,217 B1 | 4/2002 | Cunningham |
| 6,380,733 B1 | 4/2002 | Apel |
| 6,414,605 B1 | 7/2002 | Walden |
| 6,429,661 B1 | 8/2002 | Schweitzer |
| 6,433,698 B1 | 8/2002 | Schweitzer |
| 6,479,981 B2 | 11/2002 | Schweitzer |
| 6,522,247 B2 | 2/2003 | Maruyama et al. |
| 6,525,504 B1 | 2/2003 | Nygren |
| 6,535,797 B1 | 3/2003 | Bowles et al. |
| 6,573,707 B2 | 6/2003 | Kiriyama |
| 6,577,608 B1 | 6/2003 | Moon |
| 6,617,976 B2 | 9/2003 | Walden |
| 6,657,418 B2 | 12/2003 | Atherton |
| 6,671,824 B1 | 12/2003 | Hyland |
| 6,687,574 B2 | 2/2004 | Pietrowicz et al. |
| 6,734,662 B1 | 5/2004 | Fenske |
| 6,736,646 B2 | 5/2004 | Takahashi |
| 6,751,562 B1 | 6/2004 | Blackett et al. |
| 6,753,792 B2 | 6/2004 | Bechwith |
| 6,759,933 B2 | 7/2004 | Fallak |
| 6,792,337 B2 | 9/2004 | Blackett et al. |
| 6,796,821 B2 | 9/2004 | Cairns |
| 6,798,211 B1 | 9/2004 | Rockwell et al. |
| 6,816,439 B1 | 11/2004 | Kawahara |
| 6,822,576 B1 | 11/2004 | Feight |
| 6,828,906 B2 | 12/2004 | Malcolm |
| 6,892,115 B2 | 5/2005 | Berkcan et al. |
| 6,892,145 B2 | 5/2005 | Topka et al. |
| 6,894,478 B1 | 5/2005 | Fenske |
| 6,901,242 B2 | 5/2005 | Kroeger |
| 6,917,888 B2 | 7/2005 | Logvinov et al. |
| 6,944,555 B2 | 9/2005 | Blackett |
| 6,949,921 B1 | 9/2005 | Feight |
| 6,963,197 B1 | 11/2005 | Feight |
| 7,053,601 B1 | 5/2006 | Fenske |
| 7,060,379 B2 | 6/2006 | Speranza |
| 7,103,786 B2 | 9/2006 | Chen |
| 7,106,048 B1 | 9/2006 | Feight |
| 7,109,699 B1 | 9/2006 | Bierer |
| 7,132,763 B2 | 11/2006 | Rendic |
| 7,132,950 B2 | 11/2006 | Stewart |
| 7,170,194 B2 | 1/2007 | Korcharz |
| 7,254,001 B2 | 8/2007 | Papallo |
| 7,271,580 B1 | 9/2007 | Fenske |
| 7,274,168 B2 | 9/2007 | Tskukamoto |
| 7,315,169 B1 | 1/2008 | Fenske |
| 7,336,202 B2 | 2/2008 | Kawai et al. |
| 7,339,353 B1 | 4/2008 | Masias |
| 7,382,272 B2 | 6/2008 | Feight |
| 7,385,374 B2 | 6/2008 | Frantz |
| 7,406,536 B2 | 7/2008 | Efrati et al. |
| 7,411,371 B2 | 8/2008 | Hobbs |
| 7,430,932 B2 | 10/2008 | Mekhanoshin et al. |
| 7,646,308 B2 | 1/2010 | Paoletti et al. |
| 7,667,482 B2 * | 2/2010 | Mort .............. G01R 15/14 324/764.01 |

(56) References Cited

U.S. PATENT DOCUMENTS

| | | | |
|---|---|---|---|
| 7,714,735 | B2 | 5/2010 | Rockwell |
| 7,725,295 | B2 | 5/2010 | Stoupis et al. |
| 7,729,405 | B2 | 6/2010 | Inoue |
| 7,948,352 | B2 | 5/2011 | Tang |
| 8,018,337 | B2 | 9/2011 | Jones et al. |
| 8,059,006 | B2 | 11/2011 | Schweitzer et al. |
| 8,065,099 | B2 * | 11/2011 | Gibala ............... G01R 22/063 702/62 |
| 8,067,946 | B2 | 11/2011 | Muench et al. |
| 8,650,411 | B2 | 2/2014 | Feight |
| 8,665,102 | B2 | 3/2014 | Salewske |
| 10,419,064 | B2 | 9/2019 | Cosic |
| 2001/0054878 | A1 | 12/2001 | Odaohhara |
| 2002/0089802 | A1 | 7/2002 | Beckwith |
| 2003/0020332 | A1 | 1/2003 | Giannopoulos |
| 2003/0020765 | A1 | 1/2003 | Kussmaul |
| 2003/0111908 | A1 | 6/2003 | Christensen |
| 2003/0119568 | A1 | 6/2003 | Menard |
| 2003/0153368 | A1 | 8/2003 | Bussan |
| 2003/0174067 | A1 | 9/2003 | Soliman |
| 2003/0178290 | A1 | 9/2003 | Schilling |
| 2003/0179149 | A1 | 9/2003 | Savage |
| 2004/0005809 | A1 | 1/2004 | Suzuki |
| 2004/0032340 | A1 | 2/2004 | Lingafeldt |
| 2004/0036359 | A1 | 2/2004 | Griffith |
| 2004/0036478 | A1 | 2/2004 | Logvinov |
| 2004/0067366 | A1 | 4/2004 | Gorczyca |
| 2004/0078606 | A1 | 4/2004 | Chen |
| 2004/0113810 | A1 | 6/2004 | Mason |
| 2004/0214616 | A1 | 10/2004 | Malcolm |
| 2004/0233159 | A1 | 11/2004 | Badarneh |
| 2004/0256915 | A1 | 12/2004 | Phinney |
| 2005/0006956 | A1 | 1/2005 | Shi |
| 2005/0040809 | A1 | 2/2005 | Uber |
| 2005/0068193 | A1 | 3/2005 | Osterloh |
| 2005/0068194 | A1 | 3/2005 | Schleich |
| 2005/0079818 | A1 | 4/2005 | Atwater |
| 2005/0083206 | A1 * | 4/2005 | Couch ............... G01R 21/133 340/657 |
| 2005/0087599 | A1 | 4/2005 | Ward |
| 2005/0110656 | A1 | 5/2005 | Patterson |
| 2005/0132115 | A1 | 6/2005 | Leach |
| 2005/0151659 | A1 | 7/2005 | Donovon |
| 2005/0163432 | A1 | 7/2005 | Montena |
| 2005/0205395 | A1 | 9/2005 | Dietrich |
| 2005/0215280 | A1 | 9/2005 | Twitchell, Jr. |
| 2005/0253560 | A1 | 11/2005 | Popescu-Stanesti |
| 2006/0084419 | A1 | 4/2006 | Rocamora |
| 2007/0269219 | A1 | 11/2007 | Teller |
| 2008/0077336 | A1 | 3/2008 | Fernandes |
| 2008/0122518 | A1 | 5/2008 | Besser |
| 2008/0174278 | A1 | 7/2008 | Masias |
| 2009/0115426 | A1 | 5/2009 | Muench et al. |
| 2009/0119068 | A1 | 5/2009 | Banting |
| 2010/0013632 | A1 | 1/2010 | Salewske et al. |
| 2011/0084672 | A1 * | 4/2011 | Labuschagne ........ H02J 3/1878 323/255 |
| 2014/0119331 | A1 | 5/2014 | Ji |

OTHER PUBLICATIONS

Cooper Power Systems, GridAdvisor;OutageAdvisor Fault Detection and Location Solution; Cellular Communications, B320-08002, 2008, www.cooperpower.com, pp. 1-2.

Cooper Power Systems, GridAdvisor; OutageAdvisor Fault Detection and Location Solution; Sensus FlexNet Communications, B320-08003, 2008, www.cooperpower.com, pp. 1-2.

Cooper Power Systems, GridAdvisor, Exchange, B320-08004, 2008, www.cooperpower.com, pp. 1-2.

Cooper Power Systems, GridAdvisor, WebExchange, B320-08005,2008, www.cooperpower.com, pp. 1-2.

CYMBET™ Corporation, White Paper: Permanent Power for Wireless Sensors, DOC WP-72-01 rev 1, 2008, www.cymbet.com, pp. 1-4.

Tollgrade Communications Inc., LightHouse™Continuous Grid Intelligence™, 2008, www.tollgrade.com, pp. 1-4.

University of Michigan "Microchip sets low-power record with extreme sleep mode", University of Michigan News Service, Jun. 13, 2008, Ann Arbor, Michigan. Retrieved from http://www.ns.umich.edu/htdocs/releases/print.php?htdocs/releases/plainstory.php?id=661 . . . , pp. 1-2.

Joslyn Hi-Voltage "Radio Receivers Series 1560 Handheld or RTU/SCADA", Josyln Hi-Voltage, Cleveland, Ohio. 2001. Retrieved from: http://www.joclynhivoltage.com/cat1560.htm, on Jul. 21, 2008, p. 1.

Joslyn Hi-Voltage "Radio Receivers Series 1560 Handheld or RTU/SCADA Specifications", Josyln Hi-Voltage, Cleveland, Ohio. 2001. Retrieved from: http://www.joclynhivoltage.com/spec1560.htm, on Jul. 21, 2008, p. 1.

Bulgin "400 Series Buccaneer®", Dec. 9, 2003, retrieved from: www.bulgin.com.uk, pp. 32-35.

Wayne Honath "Sensors for Real-Time Distribution System Information: Key Elements of a 21st Century Grid", Tollgrade Communications, Inc. Jan. 2008, pp. 1-8.

S&C Electric Company "S&C IntelliRupter-® PulseCloser Specifications", Specification Bulletin 766-31, S&C Electric Company, Dec. 18, 2006, pp. 1-18.

Tollgrade Communications, Inc. "Tollgrade Launches Distribution Grid Monitoring Product Line At Power Industry Event in Tampa Jan. 22-24", News Release, Tollgrade Communications, Inc. Jan. 15, 2008, pp. 1-3.

Atmel Corporation "Power Management Using the Embedded Stand-Alone Wake-Up Mode Protocol. Rev. 2", Application Note, Atmel Corporation, Aug. 2002, pp. 1-19.

Fisher Pierce "Radio Faulted Circuit Indicator System", Joslyn Hi-Voltage, 1999. retrieved from http://wwwjoslynhivoltage.com/PDFFiles/rfci.pdf on Nov. 5, 2008, pp. 1-4.

S&C Electric Company "S&C IntelliRupter® PulseCloser Outdoor Distribution 14.4kV and 25 kV" Descriptive Bulletin 766-30, S&C Electric Company, Feb. 7, 2006, pp. 1-12.

Fisher Pierce "Technical Applications Data 1995", Rev. 1.0, Fisher Pierce Division of Pacific Scientific Faulted Circuit Indicators, Aug. 1995, pp. 1-67.

* cited by examiner

WIRELESS CURRENT SENSOR

TECHNICAL FIELD

This disclosure relates to systems and methods for monitoring current flow through a portion of an electric power system and utilizing the information from such monitoring to control aspects of the electrical power system. More particularly, but not exclusively, systems and methods consistent with the present disclosure may be used to control distribution equipment, such as capacitor bank controls in an electrical power distribution system.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
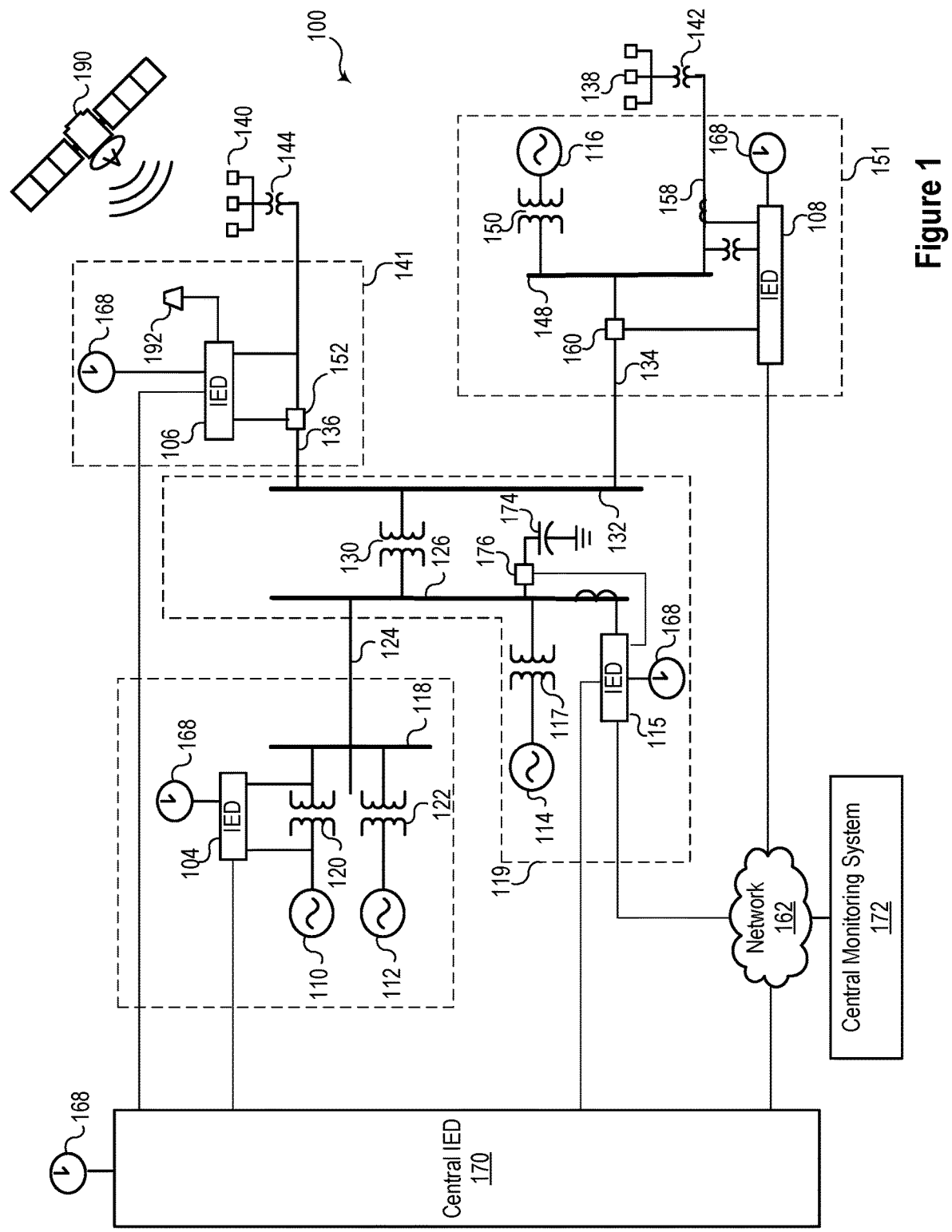
FIG. 1 illustrates a simplified one-line diagram of an electrical power delivery system consistent with embodiments of the present disclosure.

Distribution equipment such as capacitor bank controls and other equipment may utilize phasor data for operation. A phasor system measures the degree to which a voltage of the power system is out of phase with a current of the system. Devices that measure and report phasor data from the power system should provide reliable and accurate measurements without ongoing maintenance requirements and should be economical.

Electrical utilities may have voltage and current sensors installed on electrical power systems. Such systems may include cables to send the data to a control or phasor measurement unit (PMU). Voltage and current sensors may perform phasor measurement on one or more phases. Installing cabling for such sensors is relatively expensive and difficult to install in comparison to various embodiments consistent with the present disclosure.

A wireless system may be used, but such systems may have other challenges. For example, a wireless system requires that signals be time-aligned with respect to an external system (e.g., a time signal from a global navigation satellite system ("GNSS"), or inter-range instrumentation group ("IRIG") time signal). Further, making accurate voltage measurements requires a ground reference, which would make installation difficult. Finally, adding logic and processing power in the sensor would add cost and increase power consumption, thus making it more difficult to power the device without batteries.

Various embodiments consistent with the present disclosure may comprise a line-powered, easily installable device that measures line current and transmits the measurement wirelessly to a receiver and may be adapted for use in retrofit applications. The receiver may measure voltage on one or more voltage lines, for example, by use of a potential transformer (PT). The transmitter samples current over one or more cycles of the alternating current (AC) to determine the magnitude and the frequency of the current, and will prepare to send the magnitude to the receiver. The communication between the transmitter and receiver will have a roughly fixed delay. The transmitter will take this delay into account in determining when to send the message containing the magnitude of the measured current. The message is sent such that at the time the receiver is able to make use of it, the current in the line the transmitter is monitoring will be passing through the previously determined synchronization point of its waveform (e.g., the rising edge zero crossing).

The receiver measures the line voltage and determines the magnitude, recording the relative time at which the voltage reaches a certain part of its cycle, for example, the rising-edge zero crossing. Upon receipt of the message from the transmitter, the receiver captures the relative time to get the phase difference between the current and voltage waveforms. Based on the magnitude and phase angle, the system may generate phasor data.

The systems and methods disclosed herein may allow for a wireless voltage sensor to be installed in existing systems. Existing systems may receive multiple analog signals relating to currents and voltages of each phase in the system. An analog-to-digital converter may generate digitized representations of these signals, which may then be manipulated by a digital processor.

In various embodiments consistent with the present disclosure, a wireless current sensor may transmit digital data that represents analog signals that were digitized by an analog-to-digital converter (ADC). In other words, the data from the wireless current sensor may bypass the ADC and be provided directly to the processor. For use in a retrofit application, such data may be provided in a way that does not require modification of the existing hardware or firmware.

The embodiments of the disclosure will be best understood by reference to the drawings. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor do the steps need to be executed only once, unless otherwise specified.

In some cases, well-known features, structures, or operations are not shown or described in detail. Furthermore, the described features, structures, or operations may be combined in any suitable manner in one or more embodiments. It will also be readily understood that the components of the embodiments, as generally described and illustrated in the figures herein, could be arranged and designed in a wide variety of different configurations. For example, throughout this specification, any reference to "one embodiment," "an embodiment," or "the embodiment" means that a particular feature, structure, or characteristic described in connection with that embodiment is included in at least one embodiment. Thus, the quoted phrases, or variations thereof, as recited throughout this specification are not necessarily all referring to the same embodiment.

Several aspects of the embodiments disclosed herein may be implemented as software modules or components. As used herein, a software module or component may include any type of computer instruction or computer executable code located within a memory device that is operable in conjunction with appropriate hardware to implement the programmed instructions. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory machine-readable medium having stored thereon instructions that may be used to program a computer or other electronic device to perform processes described herein. The non-transitory machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable media suitable for storing electronic instructions. In some embodiments, the computer or another electronic device may include a processing device such as a microprocessor, microcontroller, logic circuitry, or the like. The processing device may further include one or more special purpose processing devices such as an application specific interface circuit (ASIC), PAL, PLA, PLD, field programmable gate array (FPGA), or any other customizable or programmable device.

Electrical power systems are designed to generate, transmit, and distribute electrical energy to loads. Electrical power systems may include equipment, such as electrical generators, electrical motors, power transformers, power transmission and distribution lines, circuit breakers, switches, buses, transmission lines, voltage regulators, capacitor banks, and the like. Such equipment may be monitored, controlled, automated, and/or protected using intelligent electronic devices (IEDs) that receive electrical power system information from the equipment, make decisions based on the information, and provide monitoring, control, protection, and/or automation outputs to the equipment.

In some embodiments, an IED may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communication processors, computing platforms, programmable logic controllers (PLCs), programmable automation controllers, input and output modules, governors, exciters, statcom controllers, static VAR compensator (SVC) controllers, on-load tap changer (OLTC) controllers, and the like. Further, in some embodiments, IEDs may be communicatively connected via a network that includes, for example, multiplexers, routers, hubs, gateways, firewalls, and/or switches to facilitate communications on the networks, each of which may also function as an IED. Networking and communication devices may also be integrated into an IED and/or be in communication with an IED. As used herein, an IED may include a single discrete IED or a system of multiple IEDs operating together. The electrical power system may be monitored, controlled, automated, and/or protected using intelligent electronic devices (IEDs). In general, IEDs in an electrical power system may be used for protection, control, automation, and/or monitoring of equipment in the system. For example, IEDs may be used to monitor equipment of many types, including electrical transmission lines, electrical distribution lines, current transformers, busses, switches, circuit breakers, reclosers, transformers, autotransformers, tap changers, voltage regulators, capacitor banks, generators, motors, pumps, compressors, valves, and a variety of other types of monitored equipment.

As used herein, an IED may refer to any microprocessor-based device that monitors, controls, automates, and/or protects monitored equipment within the electrical power system. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs.

In various embodiments, IEDs may be configured to monitor the frequency of alternating current waveforms, voltage levels, or other electrical conditions in the electrical power system. A network may be used to transmit information among various components in the electrical power system, including IEDs. In various embodiments, the network may be configured to provide streaming measurements that may be analyzed consistent with the present disclosure to detect anomalies.

A common time signal may be used to time-align measurements for comparison and/or to synchronize action across the electrical power system. Utilizing a common or universal time source may ensure that IEDs have a synchronized time signal that can be used to generate time-synchronized data, such as synchrophasors. In various embodiments, the common time source may comprise a time signal from a global navigation satellite system (GNSS) system. An IED may include a receiver configured to receive the time signal from the GNSS system. In various embodiments, the IED may distribute the time signal to other components in the electrical power system, such as other IEDs.

FIG. 1 illustrates a simplified one-line diagram of an electrical power delivery system 100 consistent with embodiments of the present disclosure. Electrical power delivery system 100 may be configured to generate, transmit, and distribute electrical energy to loads. Electrical power delivery systems may include equipment such as electrical generators (e.g., generators 110, 112, 114, and 116), power transformers (e.g., transformers 117, 120, 122, 130, 142, 144 and 150), power transmission and delivery lines (e.g., lines 124, 134, 136, and 158), circuit breakers (e.g., breakers 152, 160, 176), busses (e.g., busses 118, 126, 132, and 148), loads (e.g., loads 140 and 138) and the like. In various embodiments, the electrical generators 110, 112, 114, and 116 may comprise distributed generation sources (e.g., solar or wind generation). A variety of other types of equipment may also be included in electrical power delivery system 100, such as voltage regulators, capacitor banks, and the like.

Substation 119 may include a generator 114, which may be a distributed generator, and which may be connected to bus 126 through step-up transformer 117. Bus 126 may be connected to a distribution bus 132 via a step-down transformer 130. Various distribution lines 136 and 134 may be connected to distribution bus 132. Distribution line 136 may lead to substation 141 where the line 136 is monitored and/or controlled using IED 106, which may selectively open and close breaker 152. Load 140 may be fed from distribution line 136. Further, step-down transformer 144 in communication with distribution bus 132 via distribution line 136 may be used to step down a voltage for consumption by load 140.

Distribution line 134 may lead to substation 151 and deliver electrical power to bus 148. Bus 148 may also receive electrical power from distributed generator 116 via transformer 150. Distribution line 158 may deliver electrical power from bus 148 to load 138, and may include further step-down transformer 142. Circuit breaker 160 may be used to selectively connect bus 148 to distribution line 134. IED 108 may be used to monitor and/or control circuit breaker 160 as well as distribution line 158.

Electrical power delivery system 100 may be monitored, controlled, automated, and/or protected using IEDs, such as IEDs 104, 106, 108, 115, and 170, and a central monitoring system 172. In general, IEDs in an electrical power generation and transmission system may be used for protection, control, automation, and/or monitoring of equipment in the system. For example, IEDs may be used to monitor equipment of many types, including electrical transmission lines, electrical distribution lines, current transformers, busses, switches, circuit breakers, reclosers, transformers, autotransformers, tap changers, voltage regulators, capacitor banks, generators, motors, pumps, compressors, valves, and a variety of other types of monitored equipment.

As used herein, an IED (such as IEDs 104, 106, 108, 115, and 170) may refer to any microprocessor-based device that monitors, controls, automates, and/or protects monitored equipment within system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs.

Central monitoring system 172 may comprise one or more of a variety of types of systems. For example, central monitoring system 172 may include a supervisory control and data acquisition (SCADA) system and/or a wide area control and situational awareness (WACSA) system. A central IED 170 may be in communication with IEDs 104, 106, 108, and 115. IEDs 104, 106, 108 and 115 may be remote from the central IED 170, and may communicate over various media such as a direct communication from IED 106 or over a wide-area communications network 162. According to various embodiments, certain IEDs may be in direct communication with other IEDs (e.g., IED 104 is in direct communication with central IED 170) or may be in communication via a communication network 162 (e.g., IED 108 is in communication with central IED 170 via communication network 162).

A common time signal 168 may be used to time-align measurements for comparison and/or to synchronize action across system 100. Utilizing a common or universal time source may ensure that IEDs have a synchronized time signal that can be used to generate time-synchronized data, such as synchrophasors. In various embodiments, the common time source may comprise a time signal from a GNSS system 190. IED 106 may include a receiver 192 configured to receive the time signal from the GNSS system 190. In various embodiments, IED 106 may be configured to distribute the time signal to other components in system 100, such as IEDs 104, 108, 115, and 170.

In various embodiments, wireless current sensors may be utilized in system 100 to measure electrical parameters in system 100. Such measurements may be utilized by various control systems to implement control actions in system 100. In one specific embodiment, wireless current sensors may be utilized in connection with distribution equipment, such as capacitor bank controls and other equipment that rely on phasor data for operation. Such systems may measure the degree to which the voltage of the power system is out of phase with the current of the system. Reactive power support may be provided by selectively connecting a capacitor bank 174 to system 100 using a breaker 176.

Figure 2:
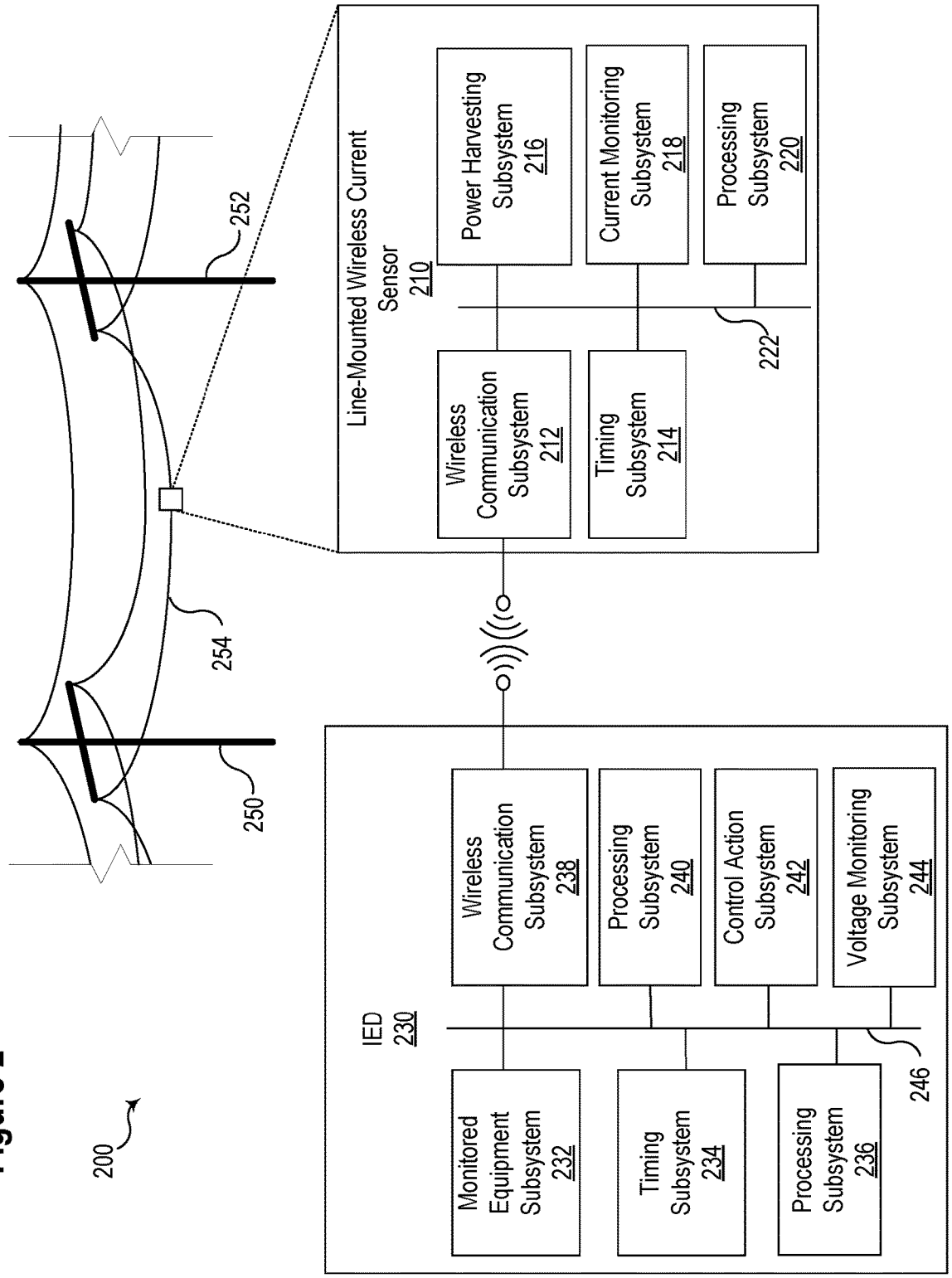
FIG. 2 illustrates a simplified representation of a system comprising a current transformer mounted to an electrical conductor and an IED consistent with embodiments of the present disclosure.

FIG. 2 illustrates a simplified representation of a system 200 comprising a wireless current sensor 210 mounted to an electrical conductor 254, and an IED 230 consistent with embodiments of the present disclosure. Line-mounted wireless current sensor 210 is mounted to conductor 254, which is suspended between pylons 250, 252. In the illustrated embodiment, only a single line-mounted wireless current sensor is used, and as such, IED 230 may assume that the currents on the other two phases are the same magnitude as the first current but shifted by 120 degrees. In other embodiments, each phase may be associated with a separate line-mounted wireless current sensor. In various embodiments, IED 230 may be embodied as a phasor measurement unit (PMU). Line-mounted wireless current sensor 210 and IED 230 each contain various subsystems represented by functional blocks. The functional blocks in line-mounted wireless current sensor 210 may communicate using data bus 222, and the functional blocks in IED 230 may communicate using data bus 246.

A wireless communication subsystem 212 may be configured to wirelessly communicate information from line-mounted wireless current sensor 210 to IED 230. Wireless communication subsystem 212 may utilize various technologies to enable wireless communication. Such communication may include radio frequency communications and may employ analog or digital modulation techniques and protocols. Wireless communication subsystem 212 may enable transmission of data from line-mounted wireless current sensor 210 related to electrical parameters associated with conductor 254. Such electrical parameters may comprise current measurements, phase measurements, and the like. In some embodiments, wireless communication subsystem 212 may enable bi-directional communication between line-mounted wireless current sensor 210 and IED 230, while in other embodiments, communication may be unidirectional.

A timing subsystem 214 may track the passage of time and provide a consistent time reference with respect to which measurements may be made. In various embodiments, line-mounted wireless current sensor 210 may receive a time signal from IED 230. Further, timing subsystem 214 may use the received time signal to associate various measurements with time stamps according to the time signal received from IED 230. In other embodiments, timing subsystem 214 may comprise an oscillator or other device capable of tracking the passage of time.

A power harvesting subsystem 216 may be capable of harvesting power from conductor 254. In some embodiments, power harvesting subsystem 216 may utilize a current transformer or other form of inductive coupling to harvest energy from conductor 254. In various embodiments, the current transformer used to harvest power from conductor 254 may also provide a signal that is analyzed and used to obtain electrical parameter measurements from conductor 254. Power harvesting subsystem 216 may further incorporate a power storage device that may be used to transmit information when current is not flowing through conductor 254 and power cannot be harvested. A power storage device may be embodied as a battery, a supercapacitor, and the like. A line-powered wireless current sensor may reduce the need for ongoing maintenance associated with devices powered with batteries.

A current monitoring subsystem 218 may be configured to monitor electrical parameters associated with conductor 254. Current monitoring subsystem 218 may sample a current flowing through conductor 254 over one or more alternating current (AC) cycles to determine the magnitude and frequency of the AC signal. Such measurements may be transmitted by wireless communication subsystem 212 to IED 230.

A processing subsystem 220 may be configured to process information received from current monitoring subsystem 218 and wireless communication subsystem 212. Processing subsystem 220 may operate using any number of processing rates and architectures. Processing subsystem 220 may be configured to perform various algorithms and calculations described herein. Processing subsystem 220 may be embodied as a general-purpose integrated circuit, an application-specific integrated circuit, a field-programmable gate array, and/or any other suitable programmable logic device.

Communication between the line-mounted wireless current sensor 210 and IED 230 may have a roughly fixed delay. System 200 may account for the transmission delay utilizing various techniques. For example, the line-mounted wireless current sensor 210 may account for the delay in connection with a schedule for transmitting messages relating to monitored electrical parameters. Alternatively, IED 230 may account for the delay associated with the transmission upon receipt of measured values. For example, a delay may be determined at a time of commissioning or periodically using a synchronization process.

In various specific embodiments, a zero-crossing point may be utilized to time align electrical parameter measurements. In one specific embodiment, messages containing electrical parameter values are sent such that at the time the receiver is able to make use of it, the current in the line the transmitter is monitoring will be passing through a previously determined synchronization point of a waveform. The synchronization point may be the rising edge zero crossing, a falling edge zero crossing, a maximum value, a minimum value, etc.

Turning now to the functional blocks associated with IED 230, a monitored equipment subsystem 232 may be in communication with monitored equipment that is operable to control an aspect or a portion of an electrical power system. The monitored equipment subsystem 232 may be configured to issue commands to and/or receive status information from monitored equipment. In certain embodiments, monitored equipment subsystem 232 may be in communication with a capacitor bank and may issue commands to selectively connect or disconnect the capacitor bank to control a phase angle between the current and the voltage of an electrical power system.

Timing subsystem 234 may track the passage of time and provide a consistent time reference with respect to which measurements may be made or which communications are received. In some embodiments, timing subsystem 234 may transmit a time signal to line-mounted wireless current sensor 210 that is used to time stamp or time align measurements made by electrical monitoring subsystem 218. Timing subsystem 234 may receive a time signal from another source (e.g., a GNSS clock signal) or may comprise an oscillator or other device capable of tracking the passage of time.

Processing subsystem 236 may process information received from voltage monitoring subsystem 244 and wireless communication subsystem 238. Processing subsystem 236 may operate using any number of processing rates and architectures. Processing subsystem 236 may be configured to perform various algorithms and calculations described herein. In various embodiments, processing subsystem 236 may be embodied as a general-purpose integrated circuit, an application-specific integrated circuit, a field-programmable gate array, and/or any other suitable programmable logic device.

A wireless communication subsystem 238 may receive information from and/or send information to line-mounted wireless current sensor 210. Wireless communication subsystem 238 may be compatible with the wireless communication subsystem 212, utilizing the same communication technology and communication protocol(s). Wireless communication subsystem 238 may communicate with line-mounted wireless current sensor 210. In various embodiments, IED 230 may also comprise other communication interfaces (e.g., a wired communication interface) to communicate with other devices, such as other IEDs, a SCADA system, etc.

A control action subsystem 242 may implement control actions based on information received from line-mounted wireless current sensor 210 and other electrical parameters associated with an AC signal on conductor 254. In some embodiments, control action subsystem 242 may control a capacitor bank, which may be selectively activated and deactivated based on electrical conditions. Control action subsystem 242 may issue commands to selectively connect and disconnect the capacitor bank using monitored equipment subsystem 232.

A voltage monitoring subsystem 244 may monitor various electrical parameters associated with electrical power flowing through conductor 254. In certain embodiments, voltage monitoring subsystem 244 may be associated with a voltage sensor (not shown). Information from a voltage sensor may be compared to a current signal received from line-mounted wireless current sensor 210 to determine a phase angle. Further, voltage monitoring subsystem 244 may be referenced to a ground, a neutral, or another phase. For instance on a delta system, an "A" phase voltage may be referenced to a "B" phase voltage.

Figure 3:
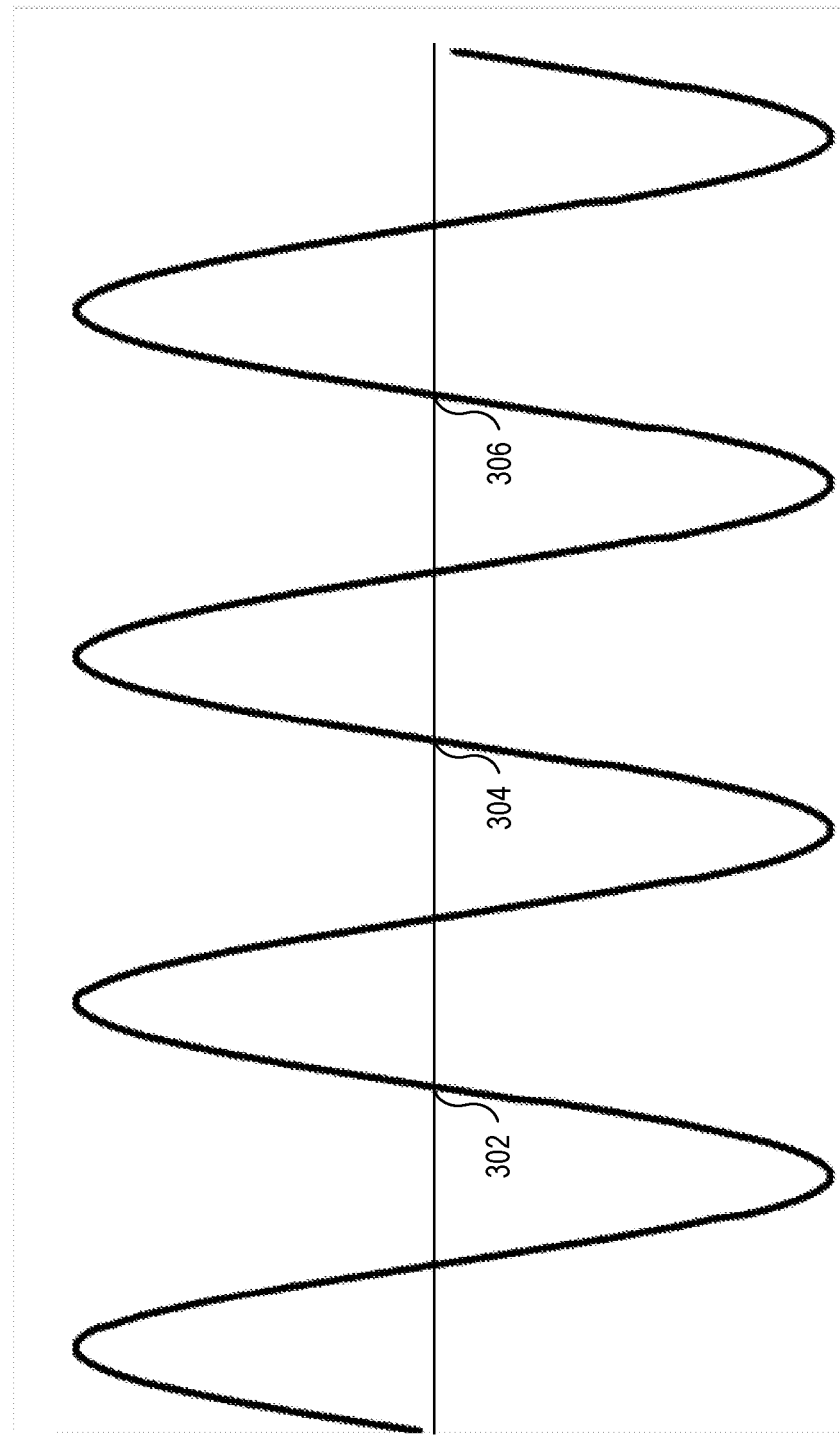
FIG. 3 illustrates a sinusoidal alternating current signal and a plurality of zero-point crossings that may be used as synchronization points consistent with embodiments of the present disclosure.

FIG. 3 illustrates a sinusoidal AC signal 300 and a plurality of zero-point crossings that may be used as synchronization points consistent with embodiments of the present disclosure. A line-mounted wireless current sensor may periodically determine the frequency and magnitude of an AC signal. The line-mounted wireless current sensor may predict the timing of a rising edge zero crossing, such as rising edge zero crossings 302, 304, and 306. The sensor may wait to send the message with information about the measured frequency and magnitude of the AC signal until a time approximately equal to a communication delay between the line-mounted wireless current sensor and a receiving device. For example, in a system in which the transmission delay is 10 microseconds, the system may transmit the measurements 10 microseconds before the rising zero-point crossing. As such, the receiving device will receive the measurement at the zero-point crossing. In this way, the signals may be time aligned.

The receiver may receive the message at the reference point (e.g., the rising edge zero crossing), and may use the information from the received message to calculate the phase. The receiver may obtain a measurement of the voltage and may calculate the phase difference using the measured voltage and the received current. Based on this information, the receiver may create a phasor measurement and perform various control functions (e.g., selectively connecting and disconnecting a capacitor bank).

Figure 4:
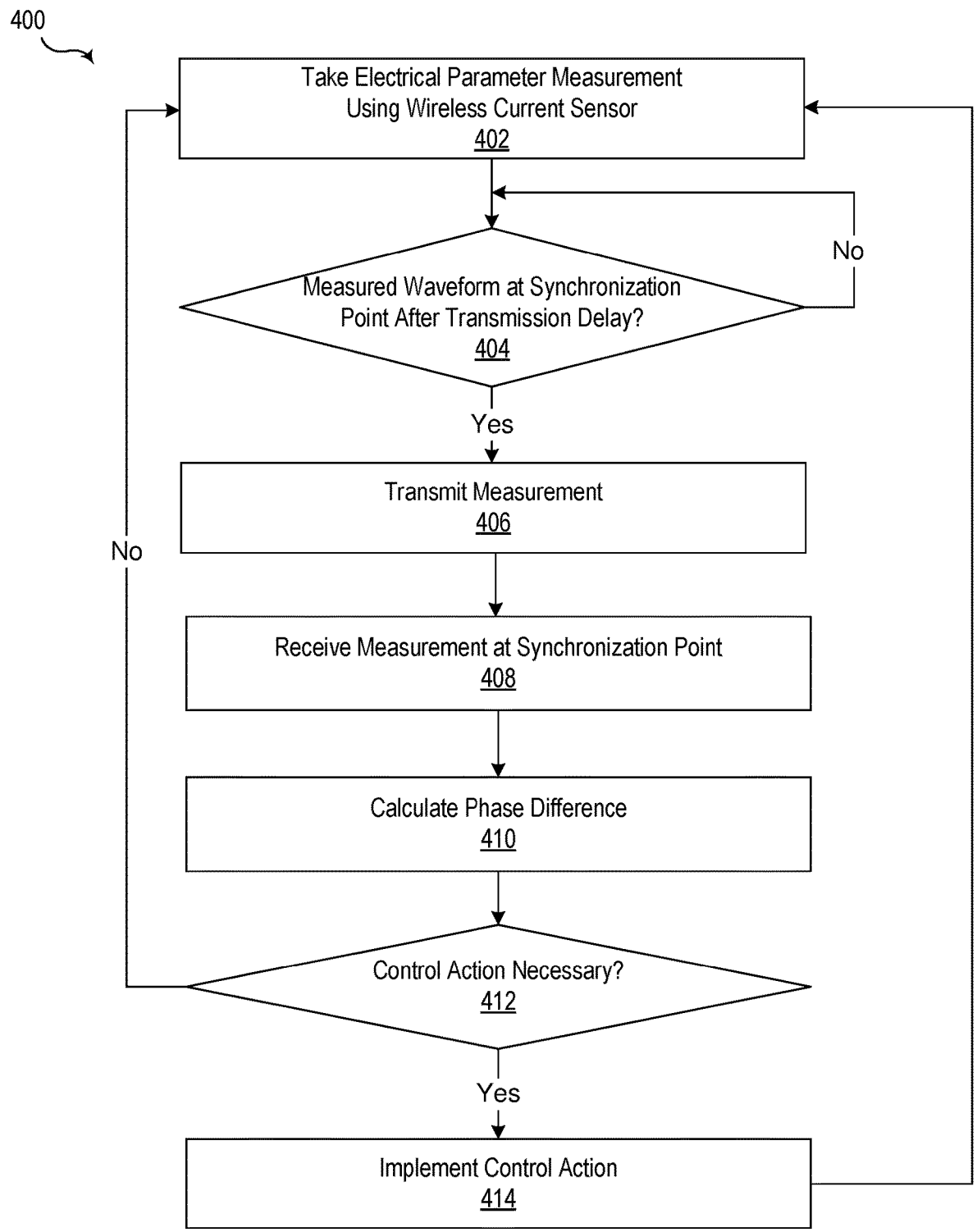
FIG. 4 illustrates a flow chart of a method for determining a phasor using a wireless current sensor and implementing an action based on that determination consistent with embodiments of the present disclosure.

FIG. 4 illustrates a flow chart of a method 400 for determining a phasor using a wireless current sensor and implementing an action based on that determination consistent with embodiments of the present disclosure. At 402, an electrical parameter may be measured using a wireless current sensor. In one embodiment, the wireless current sensor used to make the electrical parameter measurement may be embodied as line-mounted wireless current sensor 210, as illustrated in FIG. 2. In various embodiments, the electrical parameter measurement at 402 may be taken according to a schedule or after a fixed period of time has elapsed.

At 404, method 400 may determine whether the measured waveform will be at a synchronization point after a transmission delay. The transmission delay may comprise the time required to prepare and transmit the measurement taken at 402 to a receiver. In various embodiments, the rising edge zero crossing may be used as a synchronization point, as illustrated in FIG. 3. Of course, in other embodiments, other synchronization points may also be used (e.g., a maximum value, a minimum value, a falling edge zero crossing, etc.).

At 406, a wireless current sensor implementing method 400 may transmit the electrical parameter measurement obtained at 402. In various embodiments, the method may be transmitted using a radio frequency communication system. Such a system may utilize analog or digital signal modulation and a variety of communication protocols.

At 408, the measurement may be received by a receiving device implementing method 400 at a synchronization point. The receiving device may use the receiving information to calculate a phase difference at 410. In various embodiments, the phase difference and magnitude may be determined based on a voltage measurement and the received current measurement. Still further, the phase difference and magnitude may be expressed as a phasor.

At 412, system 400 may determine whether a control action is necessary based on the phase difference. In various embodiments, the control action may be implemented if the phase difference exceeds a threshold. For example, if the phase difference is too great, a capacitor bank may be selectively connected to the electric power system to provide reactive power support. In other embodiments, a variety of other types of control actions may also be implemented, as will be appreciated by one of skill in the art.

While specific embodiments and applications of the disclosure have been illustrated and described, it is to be understood that the disclosure is not limited to the specific configurations and components disclosed herein. Accordingly, many changes may be made to the details of the above-described embodiments without departing from the underlying principles of this disclosure. The scope of the present invention should, therefore, be determined only by the following claims.

What is claimed is:

1. A system to calculate a phasor in an electrical power system, the system comprising:
　a line-mounted wireless current sensor configured to be mounted to an electrical conductor in the electrical power system, comprising:
　　a current monitoring subsystem comprising a current transformer configured to generate a current measurement of an alternating current flow through an electrical conductor based on a corresponding alternating current flow induced in the current transformer;
　　a power harvesting subsystem to harvest power from the electrical conductor using the current transformer;
　　a first processing subsystem to generate a message comprising the current measurement;
　　a first timing subsystem to determine a synchronization point at which to transmit the message; and
　　a first wireless communication subsystem to transmit the message at the synchronization point; and
　an intelligent electronic device (IED), comprising:
　　a voltage monitoring subsystem to generate a voltage measurement of the alternating current flow through the electrical conductor;
　　a second wireless communication subsystem to receive the message;
　　a second processing subsystem to generate a phasor based on the current measurement and the voltage measurement;
　　a monitored equipment subsystem to interface with monitored equipment in the electrical power system; and
　　a control action subsystem to implement a control action using the monitored equipment subsystem based on the phasor.

2. The system of claim 1, wherein the IED comprises a phasor measurement unit.

3. The system of claim 1, wherein the control action comprises selectively connecting a capacitor bank.

4. The system of claim 1, wherein the synchronization point comprises a rising edge zero crossing of the alternating current.

5. The system of claim 1, wherein the synchronization point comprises one of a maximum, a minimum, and a falling edge zero crossing of the alternating current.

6. The system of claim 1, wherein the synchronization point at which to transmit the message is selected to account for a delay associated with transmission of the message.

7. The system of claim 1, wherein the IED further comprises a second timing subsystem to determine a time at which the voltage measurement of the alternating current flow is made.

8. The system of claim 1, wherein each of the first wireless communication subsystem and the second wireless communication subsystem communicate using a radio frequency.

9. The system of claim 1, wherein the voltage monitoring subsystem further comprises a voltage reference.

10. The system of claim 9, wherein the voltage reference comprises one of a ground, a neutral, and another phase.

11. A method of calculating a phasor in an electrical power system, the method comprising:
generating, using a current transformer, a current measurement of an alternating current flow through an electrical conductor based on a corresponding alternating current flow induced in the current transformer using a line-mounted wireless current sensor mounted to an electrical conductor in the electrical power system;
harvesting, using the current transformer, power from the electrical conductor;
generating a message comprising the current measurement using a first processing subsystem;
determining a synchronization point at which to transmit the message using a first timing subsystem;
transmitting the message at the synchronization point using a first wireless communication subsystem;
generating a voltage measurement of the alternating current flow through the electrical conductor using a voltage monitoring subsystem;
receiving the message using a second wireless communication subsystem;
generating a phasor based on the current measurement and the voltage measurement using a second processing subsystem; and
implementing a control action based on the phasor using a control action subsystem.

12. The method of claim 11, wherein a phasor measurement unit receives the message using the second wireless communication subsystem.

13. The method of claim 11, wherein the control action comprises one of selectively connecting and disconnecting a capacitor bank.

14. The method of claim 11, wherein the synchronization point comprises a rising edge zero crossing of the alternating current.

15. The method of claim 11, wherein the synchronization point at which to transmit the message is selected to account for a delay associated with transmission of the message.

16. The method of claim 11, further comprising determining a time at which the voltage measurement of the alternating current flow is made using a second timing system.

17. The method of claim 11, wherein the voltage monitoring subsystem further comprises a voltage reference.

18. The method of claim 17, wherein the voltage reference comprises one of a ground, a neutral, and another phase.

19. A system to measure electrical parameters in an electrical power system, the system comprising:
a line-mounted wireless current sensor configured to be mounted to an electrical conductor in the electrical power system, comprising:
a current monitoring subsystem comprising a current transformer configured to generate a current measurement of an alternating current flow through an electrical conductor based on a corresponding alternating current flow induced in the current transformer;
a power harvesting subsystem to harvest power from the electrical conductor using the current transformer;
a first processing subsystem to generate a message comprising the current measurement;
a first timing subsystem to determine a synchronization point at which to transmit the message; and
a first wireless communication subsystem to transmit the message at the synchronization point; and
an intelligent electronic device (IED), comprising:
a voltage monitoring subsystem to generate a voltage measurement of the alternating current flow through the electrical conductor;
a second wireless communication subsystem to receive the message;
a second processing subsystem to generate an electrical parameter based on the current measurement and the voltage measurement; and
a control action subsystem to implement a control action based on the electrical parameter.

* * * * *